US011124874B2

(12) United States Patent
Chung et al.

(10) Patent No.: US 11,124,874 B2
(45) Date of Patent: *Sep. 21, 2021

(54) METHODS FOR DEPOSITING METALLIC IRIDIUM AND IRIDIUM SILICIDE

(71) Applicant: Applied Materials, Inc., Santa Clara, CA (US)

(72) Inventors: Hua Chung, San Jose, CA (US); Feng Q. Liu, San Jose, CA (US); Schubert Chu, San Francisco, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 108 days.

This patent is subject to a terminal disclaimer.

(21) Appl. No.: 16/561,780

(22) Filed: Sep. 5, 2019

(65) Prior Publication Data
US 2020/0131633 A1 Apr. 30, 2020

Related U.S. Application Data

(60) Provisional application No. 62/750,571, filed on Oct. 25, 2018.

(51) Int. Cl.
C23C 16/06 (2006.01)
C23C 16/455 (2006.01)

(52) U.S. Cl.
CPC ........ C23C 16/45534 (2013.01); C23C 16/06 (2013.01); C23C 16/45553 (2013.01)

(58) Field of Classification Search
CPC ... C23C 16/06; C23C 16/42; C23C 16/45525; C23C 16/45553
See application file for complete search history.

(56) References Cited

U.S. PATENT DOCUMENTS

| 4,687,537 | A | | 8/1987 | Hoffman et al. |
| 4,871,691 | A | * | 10/1989 | Torres ............... C23C 16/42 438/676 |
| 5,306,666 | A | | 4/1994 | Izumi et al. |
| 6,344,400 | B1 | * | 2/2002 | Yutani ............... H01L 28/60 257/E21.009 |
| 6,753,249 | B1 | | 6/2004 | Chen et al. |
| 6,824,816 | B2 | | 11/2004 | Aaltonen et al. |
| 6,878,206 | B2 | | 4/2005 | Tzu et al. |
| 6,916,398 | B2 | | 7/2005 | Chen et al. |
| 7,204,886 | B2 | | 4/2007 | Chen et al. |
| 7,264,846 | B2 | | 9/2007 | Chang et al. |
| 7,404,985 | B2 | | 7/2008 | Chang et al. |
| 7,405,143 | B2 | | 7/2008 | Leinikka et al. |
| 7,658,970 | B2 | | 2/2010 | Chang et al. |
| 7,682,946 | B2 | | 3/2010 | Ma et al. |
| 7,737,028 | B2 | | 6/2010 | Wang et al. |
| 7,780,785 | B2 | | 8/2010 | Chen et al. |
| 7,850,779 | B2 | | 12/2010 | Ma et al. |
| 7,910,165 | B2 | | 3/2011 | Ganguli et al. |
| 8,110,489 | B2 | | 2/2012 | Ganguli et al. |

| 9,051,641 | B2 | | 6/2015 | Lu et al. |
| 2003/0165615 | A1 | | 9/2003 | Aaltonen et al. |
| 2004/0072016 | A1 | * | 4/2004 | Okazaki ............... C23C 14/0676 428/689 |
| 2005/0212139 | A1 | | 9/2005 | Leinikka et al. |
| 2006/0093848 | A1 | | 5/2006 | Senkevich et al. |
| 2006/0281330 | A1 | * | 12/2006 | Ahn ................. C23C 16/45529 438/778 |
| 2007/0054487 | A1 | | 3/2007 | Ma et al. |
| 2007/0119370 | A1 | | 5/2007 | Ma et al. |
| 2007/0119371 | A1 | | 5/2007 | Ma et al. |
| 2007/0128862 | A1 | | 6/2007 | Ma et al. |
| 2007/0202254 | A1 | | 8/2007 | Ganguli et al. |
| 2007/0259111 | A1 | | 11/2007 | Singh et al. |
| 2008/0096381 | A1 | * | 4/2008 | Han ................. H01L 21/76873 438/643 |
| 2008/0135914 | A1 | | 6/2008 | Krishna et al. |
| 2008/0160176 | A1 | * | 7/2008 | Blackwell ............... C23C 16/18 427/96.8 |
| 2008/0268635 | A1 | | 10/2008 | Yu et al. |

(Continued)

FOREIGN PATENT DOCUMENTS

JP 2005206874 A 8/2005
WO 2006032963 A2 3/2006

OTHER PUBLICATIONS

Hamalainen, Jani, et al., "Atomic Layer Deposition of Iridium Thin Films by Consecutive Oxidation and Reduction Steps". Chemistry of Materials, 2009, vol. 21, No. 20, 4868-4872. DOI:10.1021/cm901687w.*

Aaltonen, Titta, et al., "Atomic Layer Deposition of Iridium Thin Films". Journal of The Electrochemical Society, 151 (8) G489-G492 (2004).*

Aaltonen, Titta, et al., "Atomic layer deposition of noble metals: Exploration of the low limit of the deposition temperature". J. Mater. Res., vol. 19, No. 11, Nov. 2004, pp. 3353-3358.*

Mattinen, Mikka, et al., "Atomic Layer Deposition of Iridium Thin Films Using Sequential Oxygen and Hydrogen Pulses". The Journal of Physical Chemistry C, 2016, 120, 15235-15243.*

(Continued)

Primary Examiner — Bret P Chen
(74) Attorney, Agent, or Firm — Patterson + Sheridan, LLP

(57) ABSTRACT

Methods for depositing one or more iridium materials on a surface of a substrate are provided. A method for forming the iridium material (e.g., metallic iridium and/or iridium silicide) on the substrate can include sequentially exposing the substrate to an iridium precursor and a reducing agent during an atomic layer deposition (ALD) process within a process chamber and depositing the iridium material on the substrate. In some examples, the reducing agent can be or include hydrogen gas ($H_2$), a hydrogen plasma, atomic hydrogen, hydrazine or derivatives thereof, or any combination thereof and the deposited iridium material is metallic iridium. In other examples, the reducing agent contains one or more silicon precursors and the iridium material is an iridium silicide.

20 Claims, No Drawings

(56) References Cited

U.S. PATENT DOCUMENTS

| | | | |
|---|---|---|---|
| 2009/0004850 A1 | 1/2009 | Ganguli et al. | |
| 2009/0053426 A1 | 2/2009 | Lu et al. | |
| 2009/0258144 A1* | 10/2009 | Gatineau | C23C 16/18 427/255.28 |
| 2009/0263967 A1* | 10/2009 | Kil | H01L 21/76846 438/669 |
| 2009/0269507 A1 | 10/2009 | Yu et al. | |
| 2011/0020546 A1* | 1/2011 | Hamalainen | C23C 16/18 427/250 |
| 2013/0202794 A1* | 8/2013 | Dussarrat | C23C 16/45557 427/252 |
| 2015/0179637 A1* | 6/2015 | Pfirsch | H01L 29/66348 257/144 |
| 2016/0340792 A1* | 11/2016 | Moffat | H01L 21/2885 |
| 2017/0069724 A1* | 3/2017 | Oncel | H01L 29/78684 |
| 2017/0321320 A1 | 11/2017 | Yu et al. | |
| 2018/0291504 A1* | 10/2018 | Knisley | C23C 16/45527 |
| 2019/0055650 A1* | 2/2019 | Knisley | C23C 16/18 |
| 2019/0078203 A1* | 3/2019 | Liu | C23C 16/14 |
| 2019/0148402 A1* | 5/2019 | Yoshikawa | H01L 21/32051 257/324 |
| 2019/0206723 A1* | 7/2019 | Tokashiki | H01L 21/76843 |

OTHER PUBLICATIONS

Sprenger, Jaclyn K., et al., "Electron-enhanced atomic layer deposition of silicon thin films at room temperature". J. Vac. Sci. Technol. A 36(1), Jan./Feb. 2018, 01A118 pp. 1-10. https://doi.org/10.1116/1.5006696.*

Popis, Minh D., et al., "Study of iridium silicide monolayers using density functional theory". J. Appl. Phys. 123, 074301 (2018) pp. 1-9. https://doi.org/10.1063/1.5010331.*

Farm, Elina, et al., "Self-Assembled Octadecyltrimethoxysilane Monolayers Enabling Selective-Area Atomic Layer Deposition of Iridium". Chemical Vapor Deposition, 2006, 12, 415-417. DOI: 10.1002/cvde.200604219.*

Ryynanen, Tomi, et al., "pH electrode based on ALD deposited iridium oxide". Proc. Eurosensors XXIV, Sep. 5-8, 2010, Linz, Austria; Procedia Engineering 5 (2010) 548-551.*

Szeghalmi, Adriana, et al., "Atomic Layer Deposition of Iridium Thin Films and their Application in Gold Electrodeposition". Advances in Optical Thin Films IV, edited by Michel Lequime, H. Angus Macleod, Detlev Ristau, Proc. of SPIE vol. 8168, 81680 K-1 to K-10. doi: 10.1117/12.896818.*

PCT International Search Report and Written Opinion dated Dec. 30, 2019 for Application No. PCT/US2019/049710.

* cited by examiner

METHODS FOR DEPOSITING METALLIC IRIDIUM AND IRIDIUM SILICIDE

CROSS-REFERENCE TO RELATED APPLICATIONS

This application claims benefit to U.S. Appl. No. 62/750,571, filed on Oct. 25, 2018, which is herein incorporated by reference.

BACKGROUND

Field

Embodiments of the present disclosure generally relate to deposition processes, and in particular to vapor deposition processes for depositing materials containing iridium.

Description of the Related Art

Metallic and metal silicide films have important application in the devices for contacting materials. As device features become smaller, the metallic and metal silicide films are critical to ensure their function of the advanced device for low resistance, good process compatibility, less electromigration, and good contact with other materials during integration process. In the p/n contact metal silicides, the p contact metal silicide is more difficult in integration because of its requirement of work function. Another important requirement of the metallic and metal silicide films is their conformal deposition around contact geometry surface.

Iridium is an element that is generally avoided in vapor deposition processes such as chemical vapor deposition (CVD) and atomic layer deposition (ALD). Iridium is very rare element on earth and therefore is expensive to use in large scale. The availability of chemical precursors for iridium deposition is also very low further making iridium and iridium compounds uncommon to integrate into deposition processes.

Thus, there is a need for methods for depositing metallic iridium, iridium silicide, and other iridium materials by vapor deposition.

SUMMARY OF THE DISCLOSURE

In one or more embodiments, a method for forming an iridium material (e.g., metallic iridium or iridium silicide) on a substrate can include sequentially exposing the substrate to an iridium precursor and a reducing agent during an atomic layer deposition (ALD) process within a process chamber and depositing the iridium material on the substrate.

In other embodiments, a method for forming an iridium material on a substrate can include sequentially exposing the substrate to an iridium precursor and a reducing agent during an ALD process within a process chamber, where the reducing agent contains hydrogen gas ($H_2$), a hydrogen plasma, atomic hydrogen, or any combination thereof. The method further includes depositing the iridium material on the substrate, where the iridium material is metallic iridium which contains a concentration of greater than 95 atomic percentage (at %) of iridium.

In other embodiments, a method for forming an iridium material on a substrate can include sequentially exposing the substrate to an iridium precursor and a reducing agent during an ALD process within a process chamber, where the reducing agent contains one or more silicon precursors. The method further includes depositing the iridium material on the substrate, where the iridium material is an iridium silicide that contains about 10 at % to about 50 at % of silicon.

DETAILED DESCRIPTION

Embodiments discussed and described herein provide methods for depositing one or more iridium materials on a surface of a substrate. In one or more embodiments, a method for forming the iridium material (e.g., metallic iridium and/or iridium silicide) on the substrate can include sequentially exposing the substrate to an iridium precursor and a reducing agent during an atomic layer deposition (ALD) process within a process chamber and depositing the iridium material on the substrate. In one or more examples, the reducing agent can be or include hydrogen gas ($H_2$), a hydrogen plasma, atomic hydrogen, hydrazine, hydrazine derivatives, or any combination thereof and the deposited iridium material is metallic iridium. In other examples, the reducing agent contains one or more silicon precursors and the iridium material is an iridium silicide.

The substrate contains an underlying wafer or a base substrate in which the iridium materials and/or other materials are deposited and/or treated throughout the various processes. In one or more examples, the underlying wafer or base substrate contains, comprises of, consists of, or essentially consists of silicon, p-Si, GeSi, or Ge. In some examples, the underlying wafer or base substrate contains GeSi that includes about 10 atomic percentage (at %) to about 50 at % of germanium.

In one or more embodiments, the metallic iridium is formed, produced, or otherwise deposited on the substrate during an ALD process by sequentially exposing the substrate to the iridium precursor, a purge gas, one or more reducing agents, and a purge gas per ALD cycle. The reducing agent is or contains hydrogen or a hydrogen or electron source to produce the metallic iridium. The hydrogen or electron source is or contains one or more of hydrogen gas ($H_2$), a hydrogen plasma, atomic hydrogen, ammonia ($NH_3$), hydrazine ($N_2H_4$), monomethylhydrazine ($CH_3N_2H_3$), hydrazine derivatives, salts thereof, plasmas thereof, or any combination thereof. The carrier and/or purge gas is or contains one or more gases, such as nitrogen, argon, helium, or any combination thereof. In one or more examples, the hydrogen plasma can be generated by an in situ plasma chamber, such as a plasma-enhanced ALD (PE-ALD) chamber. In other examples, the hydrogen plasma can be generated by a remote plasma source (RPS) in fluid communication with the process chamber or the ALD chamber. The RPS can generate and provide the plasma to the substrate.

The metallic iridium is formed, produced, or otherwise deposited on the substrate in pure form. The metallic iridium contains iridium at a concentration of greater than 90 at %, greater than 95 at %, greater than 96 at %, greater than 97 at %, greater than 98 at %, greater than 99 at %, greater than 99.5 at %, greater than 99.8 at %, greater than 99.9 at %, or greater than 99.99 at %. In some embodiments, the metallic iridium contains iridium at a concentration of about 90 at %, about 95 at %, or about 96 at % to about 97 at %, about 98 at %, about 99 at %, about 99.5 at %, about 99.8 at %, about 99.9 at %, about 99.99 at %, or greater. For example, the metallic iridium contains iridium at a concentration of about 90 at % to about 99.9 at %, about 95 at % to about 99.9 at %, about 97 at % to about 99.9 at %, or about 98 at % to about 99.9 at %.

In one or more embodiments, the reducing agent can be or include one or more silicon precursor and the iridium material is or contains iridium silicide. The iridium silicide can be used as various types of films or layers throughout the substrate. In one or more examples, the iridium silicide is deposited as one or more layers or materials within a p/n contact device, such as a p-contact iridium silicide. The iridium silicide can be conformally deposited around contact geometry surface during the ALD process. In general, the iridium silicide described and discussed can be utilized to ensure function of advanced devices. For example, the iridium silicide has low resistance, good process compatibility, less electromigration, and makes great contact with other materials during integration process in comparison to traditional silicide materials.

In some embodiments, the iridium silicide is formed, produced, or otherwise deposited on the substrate during an ALD process by sequentially exposing the substrate to the iridium precursor, a purge gas, one or more reducing agents, and a purge gas per ALD cycle. The reducing agent contains a silicon precursor to produce the iridium silicide. The silicon precursor is or contains one or more of silane disilane ($Si_2H_6$), trisilane ($Si_3H_8$), tetrasilane ($Si_4H_{10}$), pentasilane ($Si_5H_{12}$), dimethylsilane ($SiC_2H_5$), methyl silane ($SiCH_6$), ethylsilane ($SiC_2H_5$), monochlorosilane ($ClSiH_3$), dichlorosilane ($Cl_2SiH_2$), tetrachlorosilane ($Cl_4Si$), hexachlorodisilane ($Si_2Cl_6$), plasmas thereof, derivatives thereof, or any combination thereof. The carrier and/or purge gas contains one or more gases, such as nitrogen, argon, helium, or any combination thereof.

The silicon concentration in the iridium silicide can be tuned with variations of flow rate, pulse time, cycle rate of the precursors, and other variables. In one or more embodiments, the iridium silicide contains silicon at a concentration of about 1 at %, about 5 at %, about 10 at %, about 12 at %, about 15 at %, about 20 at %, about 22 at %, or about 25 at % to about 28 at %, about 30 at %, about 35 at %, about 40 at %, about 45 at %, about 50 at %, about 60 at %, or about 70 at %. For example, the iridium silicide contains silicon at a concentration of about 1 at % to about 70 at %, about 1 at % to about 60 at %, about 1 at % to about 50 at %, about 1 at % to about 45 at %, about 1 at % to about 40 at %, about 1 at % to about 35 at %, about 1 at % to about 30 at %, about 1 at % to about 25 at %, about 1 at % to about 20 at %, about 1 at % to about 15 at %, about 1 at % to about 10 at %, about 10 at % to about 70 at %, about 10 at % to about 60 at %, about 10 at % to about 50 at %, about 10 at % to about 45 at %, about 10 at % to about 40 at %, about 10 at % to about 35 at %, about 10 at % to about 30 at %, about 10 at % to about 25 at %, about 10 at % to about 20 at %, about 10 at % to about 15 at %, about 10 at % to about 12 at %, about 15 at % to about 70 at %, about 15 at % to about 60 at %, about 15 at % to about 50 at %, about 15 at % to about 45 at %, about 15 at % to about 40 at %, about 15 at % to about 35 at %, about 15 at % to about 30 at %, about 15 at % to about 25 at %, or about 15 at % to about 20 at %.

The iridium silicide contains iridium at a concentration of about 30 at %, about 40 at %, about 50 at %, about 60 at %, or about 70 at % to about 75 at %, about 80 at %, about 85 at %, about 87 at %, about 90 at %, about 95 at %, about 96 at %, about 97 at %, about 98 at %, or about 99 at %. For example, the iridium silicide contains iridium at a concentration of about 30 at % to about 99 at %, about 40 at % to about 99 at %, about 50 at % to about 99 at %, about 60 at % to about 99 at %, about 70 at % to about 99 at %, about 80 at % to about 99 at %, about 90 at % to about 99 at %, about 30 at % to about 90 at %, about 40 at % to about 90 at %, about 50 at % to about 90 at %, about 60 at % to about 90 at %, about 70 at % to about 90 at %, about 80 at % to about 90 at %, about 30 at % to about 80 at %, about 40 at % to about 80 at %, about 50 at % to about 80 at %, about 60 at % to about 80 at %, about 70 at % to about 80 at %, or about 75 at % to about 80 at %.

The iridium precursor contains iridium hexafluoride. In general, when fluoride or other fluorine-containing precursors are used during a vapor deposition process, the fluorine ion or one or more fluorine by-products have great potential to attack many types of materials on the substrate (including the iridium material and other materials) or surfaces in the process chamber at elevated temperature. In some embodiments discussed and described herein, the ALD processes have great advantage with lower process temperatures to minimize the damage of fluorine ion or fluorine by-products.

The iridium material (e.g., metallic iridium or iridium silicide) contains relatively low concentration of fluorine. For example, the iridium material contains less than 5 at %, less than 3 at %, less than 2 at %, less than 1 at %, less than 0.5 at %, less than 0.1 at %, less than 0.05 at %, less than 0.01 at %, less than 500 ppm, less than 300 ppm, less than 100 ppm, less than 50 ppm, less than 20 ppm, less than 10 ppm, less than 1 ppm, less than 0.1 ppm, or less of fluorine. In one or more embodiments, the iridium material contains about 0.1 ppm to about 5 at %, about 0.1 ppm to about 3 at %, about 0.1 ppm to about 1 at %, about 0.1 ppm to about 0.5 at %, about 0.1 ppm to about 0.1 at %, about 0.1 ppm to about 0.05 at %, about 1 ppm to about 5 at %, about 1 ppm to about 3 at %, about 1 ppm to about 1 at %, about 1 ppm to about 0.5 at %, about 1 ppm to about 1 at %, about 1 ppm to about 0.05 at %, about 10 ppm to about 5 at %, about 10 ppm to about 3 at %, about 10 ppm to about 1 at %, about 10 ppm to about 0.5 at %, about 10 ppm to about 10 at %, about 10 ppm to about 0.05 at %, about 100 ppm to about 5 at %, about 100 ppm to about 3 at %, about 100 ppm to about 1 at %, about 100 ppm to about 0.5 at %, about 100 ppm to about 10 at %, or about 100 ppm to about 0.05 at % of fluorine.

The iridium material (e.g., metallic iridium or iridium silicide) is deposited or otherwise formed to a thickness of about 2 Å, about 5 Å, about 8 Å, about 10 Å, about 15 Å, about 20 Å, about 25 Å, about 30 Å, about 40 Å, or about 50 Å to about 60 Å, about 70 Å, about 80 Å, about 90 Å, about 100 Å, about 120 Å, about 150 Å, about 200 Å, about 250 Å, about 300 Å, about 400 Å, about 500 Å, or thicker. For example, the iridium material is deposited or otherwise formed to a thickness of about 2 Å to about 500 Å, about 5 Å to about 400 Å, about 5 Å to about 300 Å, about 5 Å to about 200 Å, about 5 Å to about 150 Å, about 5 Å to about 100 Å, about 5 Å to about 80 Å, about 5 Å to about 50 Å, about 5 Å to about 25 Å, about 10 Å to about 400 Å, about 10 Å to about 300 Å, about 10 Å to about 200 Å, about 10 Å to about 150 Å, about 10 Å to about 100 Å, about 10 Å to about 80 Å, about 10 Å to about 50 Å, about 10 Å to about 25 Å, about 20 Å to about 400 Å, about 20 Å to about 300 Å, about 20 Å to about 200 Å, about 20 Å to about 150 Å, about 20 Å to about 100 Å, about 20 Å to about 80 Å, about 20 Å to about 50 Å, or about 20 Å to about 25 Å.

The process chamber and/or the substrate is heated to and/or maintained at a temperature of about 0° C., about 5° C., about 10° C., about 15° C., about 20° C., about 25° C., about 30° C., about 35° C., about 40° C., about 45° C., or about 50° C. to about 60° C., about 70° C., about 80° C., about 100° C., about 120° C., about 150° C., about 180° C., about 200° C., about 250° C., about 300° C., about 350° C., about 400° C., or about 500° C. during the ALD process. In one or more examples, the process chamber and/or the substrate is heated to and/or maintained at a temperature of about 0° C. to about 500° C., about 0° C. to about 400° C., about 0° C. to about 350° C., about 0° C. to about 300° C., about 0° C. to about 250° C., about 0° C. to about 200° C., about 0° C. to about 150° C., about 0° C. to about 100° C., about 0° C. to about 80° C., about 0° C. to about 70° C., or about 0° C. to about 50° C. during the ALD process. In some examples, the process chamber and/or the substrate is heated to and/or maintained at a temperature of about 20° C. to about 500° C., about 20° C. to about 400° C., about 20° C. to about 350° C., about 20° C. to about 300° C., about 20° C. to about 250° C., about 20° C. to about 200° C., about 20° C. to about 150° C., about 20° C. to about 100° C., about 20° C. to about 80° C., about 20° C. to about 70° C., or about 20° C. to about 50° C. during the ALD process. In other examples, the process chamber and/or the substrate is heated to and/or maintained at a temperature of about 40° C. to about 500° C., about 40° C. to about 400° C., about 40° C. to about 350° C., about 40° C. to about 300° C., about 40° C. to about 250° C., about 40° C. to about 200° C., about 40° C. to about 150° C., about 40° C. to about 100° C., about 40° C. to about 80° C., about 40° C. to about 70° C., or about 40° C. to about 50° C. during the ALD process.

The process chamber is maintained at a pressure of about 0.01 Torr, about 0.05 Torr, about 0.1 Torr, about 0.5 Torr, about 0.8 Torr, or about 1 Torr to about 2 Torr, about 3 Torr, about 4 Torr, about 5 Torr, about 6 Torr, about 7 Torr, about 8 Torr, about 10 Torr, about 15 Torr, or about 20 Torr during the ALD process. For example, the process chamber is maintained at a pressure of about 0.01 Torr to about 20 Torr, about 0.1 Torr to about 20 Torr, about 0.1 Torr to about 10 Torr, about 0.1 Torr to about 8 Torr, about 0.1 Torr to about 5 Torr, about 0.1 Torr to about 3 Torr, about 0.1 Torr to about 2 Torr, about 0.1 Torr to about 1 Torr, about 1 Torr to about 20 Torr, about 1 Torr to about 10 Torr, about 1 Torr to about 8 Torr, about 1 Torr to about 5 Torr, about 1 Torr to about 3 Torr, or about 1 Torr to about 2 Torr during the ALD process.

The substrate is exposed to the iridium precursor for about 0.01 seconds, about 0.05 seconds, about 0.1 seconds, about 0.2 seconds, about 0.3 seconds, about 0.4 seconds, or about 0.5 seconds to about 0.6 seconds, about 0.7 seconds, about 0.8 seconds, about 0.9 seconds, about 1 second, about 1.2 seconds, about 1.5 seconds, about 1.8 seconds, about 2 seconds, about 2.5 seconds, about 3 seconds, about 4 seconds, about 5 seconds, about 7 seconds, about 8 seconds, about 10 seconds, or longer during each cycle of the ALD process. For example, the substrate is exposed to the iridium precursor for about 0.01 seconds to about 10 seconds, about 0.01 seconds to about 8 seconds, about 0.01 seconds to about 5 seconds, about 0.01 seconds to about 4 seconds, about 0.01 seconds to about 3 seconds, about 0.01 seconds to about 2 seconds, about 0.01 seconds to about 1 second, about 0.01 seconds to about 0.8 seconds, about 0.01 seconds to about 0.5 seconds, about 0.01 seconds to about 0.4 seconds, about 0.01 seconds to about 0.3 seconds, about 0.01 seconds to about 0.2 seconds, about 0.01 seconds to about 0.1 seconds, about 0.1 seconds to about 10 seconds, about 0.1 seconds to about 8 seconds, about 0.1 seconds to about 5 seconds, about 0.1 seconds to about 4 seconds, about 0.1 seconds to about 3 seconds, about 0.1 seconds to about 2 seconds, about 0.1 seconds to about 1 second, about 0.1 seconds to about 0.8 seconds, about 0.1 seconds to about 0.5 seconds, about 0.1 seconds to about 0.4 seconds, about 0.1 seconds to about 0.3 seconds, or about 0.1 seconds to about 0.2 seconds during each cycle of the ALD process.

The substrate is exposed to the reducing agent for about 0.1 seconds, about 0.5 seconds, about 0.8 seconds, about 1 second, about 1.5 seconds, about 1.8 seconds, about 2 seconds, about 2.5 seconds, about 3 seconds, or about 4 seconds to about 5 seconds, about 6 seconds, about 7 seconds, about 8 seconds, about 10 seconds, about 12 seconds, about 15 seconds, about 18 seconds, about 20 seconds, about 25 seconds, about 30 seconds, about 40 seconds, about 50 seconds, or longer during each cycle of the ALD process. For example, the substrate is exposed to the reducing agent for about 0.5 seconds to about 50 seconds, about 1 second to about 40 seconds, about 1 second to about 30 seconds, about 1 second to about 25 seconds, about 1 second to about 20 seconds, about 1 second to about 15 seconds, about 1 second to about 12 seconds, about 1 second to about 10 seconds, about 1 second to about 8 seconds, about 1 second to about 5 seconds, about 1 second to about 3 seconds, about 2 seconds to about 40 seconds, about 2 seconds to about 30 seconds, about 2 seconds to about 25 seconds, about 2 seconds to about 20 seconds, about 2 seconds to about 15 seconds, about 2 seconds to about 12 seconds, about 2 seconds to about 10 seconds, about 2 seconds to about 8 seconds, about 2 seconds to about 5 seconds, or about 2 seconds to about 3 seconds during each cycle of the ALD process.

The substrate is exposed to the purge or carrier gas for about 0.5 seconds, about 1 second, about 2 seconds, about 2.5 seconds, about 3 seconds, or about 4 seconds to about 5 seconds, about 6 seconds, about 8 seconds, about 10 seconds, about 15 seconds, about 20 seconds, about 25 seconds, about 30 seconds, about 40 seconds, about 50 seconds, about 60 seconds, about 70 seconds, about 80 seconds, about 90 seconds, about 100 seconds, about 120 seconds, or longer during each cycle of the ALD process. For example, the substrate is exposed to the purge or carrier gas for about 0.5 seconds to about 120 seconds, about 1 second to about 120 seconds, about 1 second to about 100 seconds, about 1 second to about 90 seconds, about 1 second to about 70 seconds, about 1 second to about 50 seconds, about 1 second to about 40 seconds, about 1 second to about 30 seconds, about 1 second to about 25 seconds, about 1 second to about 20 seconds, about 1 second to about 15 seconds, about 1 second to about 10 seconds, about 1 second to about 8 seconds, about 1 second to about 5 seconds, about 1 second to about 3 seconds, about 5 seconds to about 120 seconds, about 5 seconds to about 100 seconds, about 5 seconds to about 90 seconds, about 5 seconds to about 70 seconds, about 5 seconds to about 50 seconds, about 5 seconds to about 40 seconds, about 5 seconds to about 30 seconds, about 5 seconds to about 25 seconds, about 5 seconds to about 20 seconds, about 5 seconds to about 15 seconds, about 5 seconds to about 10 seconds, or about 5 seconds to about 8 seconds during each cycle of the ALD process.

In one or more examples, each cycle of the ALD process includes exposing the substrate to the iridium precursor for about 0.1 seconds to about 1 second while not exposing the substrate to the reducing agent, then exposing the substrate to a purge gas for about 1 second to about 100 seconds, then exposing the substrate to the reducing agent for about 1 second to about 20 seconds while not exposing the substrate to the iridium precursor, and then exposing the substrate to the purge gas for about 1 second to about 100 seconds. In some examples, each cycle of the ALD process includes exposing the substrate to the iridium precursor for about 0.1 seconds to about 1 second while not exposing the substrate to the reducing agent, then exposing the substrate to a purge gas for about 1 second to about 20 seconds, then exposing the substrate to the reducing agent for about 2 seconds to about 10 seconds while not exposing the substrate to the iridium precursor, and then exposing the substrate to the purge gas for about 1 second to about 20 seconds. In other examples, each cycle of the ALD process includes exposing the substrate to the iridium precursor for about 0.1 seconds to about 0.5 seconds while not exposing the substrate to the reducing agent, then exposing the substrate to a purge gas for about 1 second to about 5 seconds, then exposing the substrate to the reducing agent for about 2 seconds to about 5 seconds while not exposing the substrate to the iridium precursor, and then exposing the substrate to the purge gas for about 1 second to about 5 seconds.

The iridium precursor is introduced into the process chamber and/or exposed to the substrate at a flow rate of about 10 sccm, about 50 sccm, about 100 sccm, about 200 sccm, or about 300 sccm to about 400 sccm, about 500 sccm, about 700 sccm, about 1,000 sccm, about 1,200 sccm, about 1,500 sccm, about 1,800 sccm, or about 2,000 sccm. For example, the iridium precursor is introduced into the process chamber and/or exposed to the substrate at a flow rate of about 10 sccm to about 2,000 sccm, about 10 sccm to about 1,500 sccm, about 10 sccm to about 1,000 sccm, about 10 sccm to about 800 sccm, about 10 sccm to about 500 sccm, about 10 sccm to about 300 sccm, about 10 sccm to about 100 sccm, about 100 sccm to about 2,000 sccm, about 100 sccm to about 1,500 sccm, about 100 sccm to about 1,000 sccm, about 100 sccm to about 800 sccm, about 100 sccm to about 500 sccm, or about 100 sccm to about 300 sccm.

The iridium precursor can be introduced into the process chamber and/or exposed to the substrate as a precursor mixture containing the iridium precursor and one or more carrier gases. The carrier gas can be or include one or more gases, such as nitrogen, argon, helium, or any combination thereof. In one or more embodiments, the precursor mixture can include the iridium precursor (e.g., $IrF_6$) at a concentration of about 0.1 at %, about 0.5 at %, about 0.8 at %, about 1 at %, about 2 at %, or about 3 at % to about 5 at %, about 6 at %, about 8 at %, or about 10 at %, and the remainder is the carrier gas.

The reducing agent is introduced into the process chamber and/or exposed to the substrate at a flow rate of about 10 sccm, about 50 sccm, about 100 sccm, about 200 sccm, or about 300 sccm to about 500 sccm, about 700 sccm, about 1,000 sccm, about 1,500 sccm, about 2,000 sccm, about 2,500 sccm, or about 3,000 sccm. For example, the reducing agent is introduced into the process chamber and/or exposed to the substrate at a flow rate of about 10 sccm to about 3,000 sccm, about 10 sccm to about 2,500 sccm, about 10 sccm to about 2,000 sccm, about 10 sccm to about 1,500 sccm, about 10 sccm to about 1,000 sccm, about 10 sccm to about 800 sccm, about 10 sccm to about 500 sccm, about 10 sccm to about 100 sccm, about 200 sccm to about 3,000 sccm, about 200 sccm to about 2,500 sccm, about 200 sccm to about 2,000 sccm, about 200 sccm to about 1,500 sccm, about 200 sccm to about 1,000 sccm, about 200 sccm to about 800 sccm, or about 200 sccm to about 500 sccm.

The reducing agent can be introduced into the process chamber and/or exposed to the substrate as a precursor mixture containing the reducing agent and one or more carrier gases. The carrier gas can be or include one or more gases, such as nitrogen, argon, helium, or any combination thereof. In one or more embodiments, the precursor mixture can include the reducing agent (e.g., $Si_4H_{10}$) at a concentration of about 0.5 at %, about 0.8 at %, about 1 at %, about 2 at %, or about 3 at % to about 5 at %, about 6 at %, about 8 at %, about 10 at %, about 12 at %, about 15 at %, or about 20 at %, and the remainder is the carrier gas.

The purge or carrier gas is introduced into the process chamber and/or exposed to the substrate at a flow rate of about 50 sccm, about 100 sccm, about 200 sccm, or about 300 sccm to about 500 sccm, about 700 sccm, about 1,000 sccm, about 1,500 sccm, about 2,000 sccm, about 2,500 sccm, about 3,000 sccm, about 4,000 sccm, or about 5,000 sccm. For example, the purge or carrier gas is introduced into the process chamber and/or exposed to the substrate at a flow rate of about 50 sccm to about 5,000 sccm, about 50 sccm to about 4,000 sccm, about 50 sccm to about 3,000 sccm, about 50 sccm to about 2,500 sccm, about 50 sccm to about 2,000 sccm, about 50 sccm to about 1,500 sccm, about 50 sccm to about 1,000 sccm, about 50 sccm to about 800 sccm, about 50 sccm to about 500 sccm, about 50 sccm to about 100 sccm, about 200 sccm to about 5,000 sccm, about 200 sccm to about 4,000 sccm, about 200 sccm to about 3,000 sccm, about 200 sccm to about 2,500 sccm, about 200 sccm to about 2,000 sccm, about 200 sccm to about 1,500 sccm, about 200 sccm to about 1,000 sccm, about 200 sccm to about 800 sccm, or about 200 sccm to about 500 sccm.

The iridium material (e.g., metallic iridium or iridium silicide) is deposited at a rate of about 0.2 Å/cycle, about 0.4 Å/cycle, about 0.5 Å/cycle, about 0.8 Å/cycle, about 1 Å/cycle, about 2 Å/cycle, about 3 Å/cycle, about 5 Å/cycle, or about 8 Å/cycle to about 10 Å/cycle, about 12 Å/cycle, about 15 Å/cycle, about 20 Å/cycle, about 25 Å/cycle, about 30 Å/cycle, about 40 Å/cycle, about 50 Å/cycle, about 70 Å/cycle, or faster. Each cycle is an ALD cycle that includes exposing the substrate sequentially to the iridium precursor, the purge gas, the reducing agent, and the purge gas. For example, the iridium material is deposited at a rate of about 0.2 Å/cycle to about 70 Å/cycle, about 0.4 Å/cycle to about 70 Å/cycle, about 0.5 Å/cycle to about 70 Å/cycle, about 0.8 Å/cycle to about 70 Å/cycle, about 1 Å/cycle to about 70 Å/cycle, about 2 Å/cycle to about 70 Å/cycle, about 5 Å/cycle to about 70 Å/cycle, about 8 Å/cycle to about 70 Å/cycle, about 10 Å/cycle to about 70 Å/cycle, about 0.4 Å/cycle to about 50 Å/cycle, about 0.5 Å/cycle to about 50 Å/cycle, about 0.8 Å/cycle to about 50 Å/cycle, about 1 Å/cycle to about 50 Å/cycle, about 2 Å/cycle to about 50 Å/cycle, about 5 Å/cycle to about 50 Å/cycle, about 8 Å/cycle to about 50 Å/cycle, about 10 Å/cycle to about 50 Å/cycle, about 0.4 Å/cycle to about 30 Å/cycle, about 0.5 Å/cycle to about 30 Å/cycle, about 0.8 Å/cycle to about 30 Å/cycle, about 1 Å/cycle to about 30 Å/cycle, about 2 Å/cycle to about 30 Å/cycle, about 5 Å/cycle to about 30 Å/cycle, about 8 Å/cycle to about 30 Å/cycle, or about 10 Å/cycle to about 30 Å/cycle.

In one or more embodiments, the ALD process discussed and described herein is used to selectively deposit the iridium material on a primary surface on the substrate while not depositing a secondary surface or depositing on the primary surface at a much faster rate (e.g., from about 2 times faster to at or greater than 100 times faster) than on the secondary surface. In one or more examples, the substrate contains a primary or silicon surface and a secondary surface. The secondary surface contains silicon nitride, silicon oxide, silicon oxynitride, aluminum oxide, hafnium oxide, alloys thereof, other high-k materials, or any combination thereof. The iridium material is selectively deposited on the primary or silicon surface over the secondary surface during an ALD process. In some examples, the iridium material is deposited on the primary or silicon surface and none or substantially none of the iridium material is deposited on the secondary surface during the ALD process. In other examples, the iridium material is deposited on the primary or silicon surface at a rate of about 2 times, about 5 times, or about 10 times to about 20 times, about 50 times, about 100 times, or about 200 times faster than on the secondary surface during the ALD process.

The time interval for the pulse of the iridium precursor is variable depending upon a number of factors such as, for example, the volume capacity of the process chamber employed, the vacuum system coupled thereto and the volatility/reactivity of the reactants used during the ALD process. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the iridium precursor provides a sufficient amount of precursor so that at least a monolayer of the iridium precursor is adsorbed on the substrate. Thereafter, excess iridium precursor remaining in the chamber may be removed from the process chamber by the constant carrier gas stream in combination with the vacuum system.

The time interval for each of the pulses of the iridium precursor and the reducing agent may have the same duration. That is, the duration of the pulse of the iridium precursor may be identical to the duration of the pulse of the reducing agent. For such embodiments, a time interval ($T_1$) for the pulse of the iridium precursor is equal to a time interval ($T_2$) for the pulse of the reducing agent.

Alternatively, the time interval for each of the pulses of the iridium precursor and the reducing agent may have different durations. That is, the duration of the pulse of the iridium precursor may be shorter or longer than the duration of the pulse of the reducing agent. For such embodiments, a time interval ($T_1$) for the pulse of the iridium precursor is different than the time interval ($T_2$) for the pulse of the reducing agent.

In addition, the periods of non-pulsing between each of the pulses of the iridium precursor and the reducing agent may have the same duration. That is, the duration of the period of non-pulsing between each pulse of the iridium precursor and each pulse of the reducing agent is identical. For such embodiments, a time interval ($T_3$) of non-pulsing between the pulse of the iridium precursor and the pulse of the reducing agent is equal to a time interval ($T_4$) of non-pulsing between the pulse of the reducing agent and the pulse of the iridium precursor during the time periods of non-pulsing, the carrier and/or purge gas stream (e.g., constant or variable stream) is provided to the process chamber.

Alternatively, the periods of non-pulsing between each of the pulses of the iridium precursor and the reducing agent may have different duration. That is, the duration of the period of non-pulsing between each pulse of the iridium precursor and each pulse of the reducing agent may be shorter or longer than the duration of the period of non-pulsing between each pulse of the reducing agent and the iridium precursor. For such embodiments, a time interval ($T_3$) of non-pulsing between the pulse of the iridium precursor and the pulse of the reducing agent is different from a time interval ($T_4$) of non-pulsing between the pulse of the reducing agent and the pulse of iridium precursor. During the time periods of non-pulsing, the carrier and/or purge gas stream (e.g., constant or variable stream) is provided to the process chamber.

Additionally, the time intervals for each pulse of the iridium precursor, the reducing agent and the periods of non-pulsing therebetween for each deposition cycle may have the same duration. For such embodiments, a time interval ($T_1$) for the iridium precursor, a time interval ($T_2$) for the reducing agent, a time interval ($T_3$) of non-pulsing between the pulse of the iridium precursor and the pulse of the reducing agent and a time interval ($T_4$) of non-pulsing between the pulse of the reducing agent and the pulse of the iridium precursor each have the same value for each deposition cycle. For example, in a first deposition cycle ($C_1$), a time interval ($T_1$) for the pulse of the iridium precursor has the same duration as the time interval ($T_1$) for the pulse of the iridium precursor in subsequent deposition cycles ($C_2 \ldots C_n$). Similarly, the duration of each pulse of the reducing agent and the periods of non-pulsing between the pulse of the iridium precursor and the reducing agent in the first deposition cycle ($C_1$) is the same as the duration of each pulse of the reducing agent and the periods of non-pulsing between the pulse of the iridium precursor and the reducing agent in subsequent deposition cycles ($C_2 \ldots C_n$), respectively.

Alternatively, the time intervals for at least one pulse of the iridium precursor, the reducing agent and the periods of non-pulsing therebetween for one or more of the deposition cycles of the iridium material deposition process may have different durations. For such embodiments, one or more of the time intervals ($T_1$) for the pulses of the iridium precursor, the time intervals ($T_2$) for the pulses of the reducing agent, the time intervals ($T_3$) of non-pulsing between the pulse of the iridium precursor and the reducing agent and the time intervals ($T_4$) of non-pulsing between the pulses of the reducing agent and the iridium precursor may have different values for one or more deposition cycles of the cyclical deposition process. For example, in a first deposition cycle ($C_1$), the time interval ($T_1$) for the pulse of the iridium precursor may be longer or shorter than one or more time interval ($T_1$) for the pulse of the iridium precursor in subsequent deposition cycles ($C_2 \ldots C_n$). Similarly, the durations of the pulses of the reducing agent and the periods of non-pulsing between the pulse of the iridium precursor and the reducing agent in the first deposition cycle ($C_1$) may be the same or different than the duration of each pulse of the reducing agent and the periods of non-pulsing between the pulse of the iridium precursor and the reducing agent in subsequent deposition cycles ($C_2 \ldots C_n$).

In some embodiments, a constant flow of a carrier gas or a purge gas may be provided to the process chamber modulated by alternating periods of pulsing and non-pulsing where the periods of pulsing alternate between the iridium precursor and the reducing agent along with the carrier/purge gas stream, while the periods of non-pulsing include only the carrier/purge gas stream.

Embodiments of the invention provide a method to deposit iridium materials on a substrate by various vapor deposition processes, such as ALD and plasma-enhanced ALD (PE-ALD). The PE-ALD processes may generate a plasma in situ or by a remote plasma source (RPS). Iridium materials include metallic iridium and iridium silicide materials, as described herein. In one or more embodiments, the iridium material is deposited on a substrate by sequentially exposing the substrate to a reagent or reducing agent and an iridium precursor during an ALD process. In some embodiments, one or more reducing agents (e.g., $H_2$, H-plasma, other electron donors) are used as the reagent to form metallic iridium. In other embodiments, one or more silicon precursors are used as the reagent or reducing agent to form iridium material as an iridium silicide.

In one or more embodiments, an iridium material may be formed during a PE-ALD process containing a constant flow of a reducing agent while providing sequential pulses of an iridium precursor and a plasma. In some embodiments, an iridium material may be formed during another PE-ALD process that provides sequential pulses of an iridium precursor and a reducing agent plasma. In these embodiments, the reagent is generally ionized or radicalized during the process. Also, the PE-ALD process provides that the plasma may be generated external from the process chamber, such as by a RPS system or the plasma may be generated in situ a plasma capable ALD process chamber. During PE-ALD processes, a plasma may be generated from a microwave (MW) frequency generator or a radio frequency (RF) generator. In some examples, an in situ plasma is generated by a RF generator. In other embodiments, an iridium material may be formed during a thermal ALD process that provides sequential pulses of an iridium precursor and a reagent or reducing agent. An ALD process chamber used during embodiments described herein is available from Applied Materials, Inc., located in Santa Clara, Calif.

Embodiments of the present disclosure further relate to any one or more of the following paragraphs 1-32:

1. A method for forming an iridium material on a substrate, comprising: sequentially exposing the substrate to an iridium precursor and a reducing agent during an atomic layer deposition process within a process chamber; and depositing the iridium material on the substrate.

2. A method for forming an iridium material on a substrate, comprising: sequentially exposing the substrate to an iridium precursor and a reducing agent during an atomic layer deposition process within a process chamber, wherein the reducing agent comprises hydrogen gas ($H_2$), a hydrogen plasma, atomic hydrogen, or any combination thereof; and depositing the iridium material on the substrate, wherein the iridium material is metallic iridium which comprises a concentration of greater than 95 at % of iridium.

3. A method for forming an iridium material on a substrate, comprising: sequentially exposing the substrate to an iridium precursor and a reducing agent during an atomic layer deposition process within a process chamber, wherein the reducing agent comprises a silicon precursor; and depositing the iridium material on the substrate, wherein the iridium material is an iridium silicide, and wherein the iridium silicide comprises about 10 at % to about 50 at % of silicon.

4. The method according to any one of paragraphs 1-3, wherein the reducing agent comprises hydrogen and the iridium material comprises metallic iridium.

5. The method of paragraph 4, wherein the reducing agent comprises hydrogen gas ($H_2$), a hydrogen plasma, atomic hydrogen, hydrazine, hydrazine derivatives or salts, or any combination thereof.

6. The method of paragraph 4, wherein the metallic iridium has a concentration of greater than 95 at % of iridium.

7. The method of paragraph 4, wherein the metallic iridium has a concentration of greater than 99 at % of iridium.

8. The method of paragraph 4, wherein the metallic iridium has a concentration of greater than 99.8 at % of iridium.

9. The method of paragraph 4, wherein the metallic iridium is deposited to a thickness of about 10 Å to about 80 Å.

10. The method according to any one of paragraphs 1-9, wherein the reducing agent comprises a silicon precursor and the iridium material comprises iridium silicide.

11. The method of paragraph 10, wherein the silicon precursor comprises silane, disilane, trisilane, tetrasilane, pentasilane, monochlorosilane, dichlorosilane, or any combination thereof.

12. The method of paragraph 10, wherein the iridium silicide comprises about 10 at % to about 50 at % of silicon.

13. The method of paragraph 10, wherein the iridium silicide is deposited as a layer within a p/n contact device.

14. The method of paragraph 10, wherein the iridium silicide is deposited to a thickness of about 10 Å to about 80 Å.

15. The method according to any one of paragraphs 1-14, wherein the iridium precursor comprises iridium hexafluoride.

16. The method according to any one of paragraphs 1-15, wherein the iridium material has a concentration of less than 5 at % of fluorine.

17. The method according to any one of paragraphs 1-16, wherein the iridium material has a concentration of less than 1 at % of fluorine.

18. The method according to any one of paragraphs 1-17, wherein the iridium material has a concentration of less than 0.1 at % of fluorine.

19. The method according to any one of paragraphs 1-18, wherein the iridium material has a concentration of less than 100 ppm of fluorine.

20. The method according to any one of paragraphs 1-19, wherein the process chamber is heated to and/or maintained at a temperature of about 0° C. to about 500° C. during the atomic layer deposition process.

21. The method according to any one of paragraphs 1-20, wherein the process chamber is heated to and/or maintained at a temperature of about 0° C. to about 350° C. during the atomic layer deposition process.

22. The method according to any one of paragraphs 1-21, wherein the process chamber is heated to and/or maintained at a temperature of about 0° C. to about 100° C. during the atomic layer deposition process.

23. The method according to any one of paragraphs 1-22, wherein the process chamber is heated to and/or maintained at a temperature of about 0° C. to about 70° C. during the atomic layer deposition process.

24. The method according to any one of paragraphs 1-23, wherein each cycle of the atomic layer deposition process comprises: exposing the substrate to the iridium precursor for about 0.1 seconds to about 1 second while not exposing the substrate to the reducing agent; then exposing the substrate to a purge gas for about 1 second to about 100 seconds; then exposing the substrate to the reducing agent for about 1 second to about 20 seconds while not exposing the substrate to the iridium precursor; and then exposing the substrate to the purge gas for about 1 second to about 100 seconds.

25. The method according to any one of paragraphs 1-24, wherein each cycle of the atomic layer deposition process comprises: exposing the substrate to the iridium precursor for about 0.1 seconds to about 1 second while not exposing the substrate to the reducing agent; then exposing the substrate to a purge gas for about 1 second to about 20 seconds; then exposing the substrate to the reducing agent for about 2 seconds to about 10 seconds while not exposing the substrate to the iridium precursor; and then exposing the substrate to the purge gas for about 1 second to about 20 seconds.

26. The method according to any one of paragraphs 1-25, wherein each cycle of the atomic layer deposition process comprises: exposing the substrate to the iridium precursor for about 0.1 seconds to about 0.5 seconds while not exposing the substrate to the reducing agent; then exposing the substrate to a purge gas for about 1 second to about 5 seconds; then exposing the substrate to the reducing agent for about 2 seconds to about 5 seconds while not exposing the substrate to the iridium precursor; and then exposing the substrate to the purge gas for about 1 second to about 5 seconds.

27. The method according to any one of paragraphs 1-26, wherein the iridium material is deposited at a rate of about 0.4 Å/cycle to about 50 Å/cycle.

28. The method of paragraph 27, wherein the purge gas comprises nitrogen, argon, helium, or any combination thereof.

29. The method according to any one of paragraphs 1-28, wherein the substrate comprises a silicon surface and a secondary surface, and wherein the secondary surface comprises silicon nitride, silicon oxide, silicon oxynitride, aluminum oxide, hafnium oxide, alloys thereof, or any combination thereof.

30. The method of paragraph 29, wherein the iridium material is selectively deposited on the silicon surface over the secondary surface during the atomic layer deposition process.

31. The method of paragraph 29, wherein the iridium material is deposited on the silicon surface at a rate of about 2 times to about 100 times faster than deposited on the secondary surface during the atomic layer deposition process.

32. The method according to any one of paragraphs 1-31, wherein the substrate comprises an underlying wafer, the underlying wafer consists of silicon, p-Si, GeSi, or Ge.

While the foregoing is directed to implementations of the disclosure, other and further implementations may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for forming an iridium material on a substrate, comprising:
sequentially exposing the substrate to an iridium precursor and a reducing agent during an atomic layer deposition process within a process chamber, wherein the iridium precursor comprises iridium hexafluoride; and
depositing the iridium material on the substrate, wherein the iridium material has a concentration of about 0.1 ppm to less than 1 at % of fluorine.

2. The method of claim 1, wherein the reducing agent comprises hydrogen and the iridium material comprises metallic iridium.

3. The method of claim 2, wherein the reducing agent comprises hydrogen gas ($H_2$), a hydrogen plasma, atomic hydrogen, hydrazine, hydrazine derivatives or salts, or any combination thereof.

4. The method of claim 2, wherein the metallic iridium has a concentration of greater than 99 atomic percentage (at %) of iridium.

5. The method of claim 2, wherein the metallic iridium is deposited to a thickness of about 10 Å to about 80 Å.

6. The method of claim 1, wherein the iridium material has a concentration of about 0.1 ppm to about 0.1 at % of fluorine.

7. The method of claim 1, wherein the reducing agent comprises a silicon precursor and the iridium material comprises iridium silicide.

8. The method of claim 7, wherein the silicon precursor comprises silane, disilane, trisilane, tetrasilane, pentasilane, monochlorosilane, dichlorosilane, or any combination thereof.

9. The method of claim 7, wherein the iridium silicide comprises about 10 at % to about 50 at % of silicon.

10. The method of claim 7, wherein the iridium silicide is deposited as a layer within a p/n contact device.

11. The method of claim 7, wherein the iridium silicide is deposited to a thickness of about 10 Å to about 80 Å.

12. The method of claim 1, wherein the process chamber is maintained at a temperature of about 0° C. to about 500° C. during the atomic layer deposition process.

13. The method of claim 1, wherein the process chamber is maintained at a temperature of about 0° C. to about 100° C. during the atomic layer deposition process.

14. The method of claim 1, wherein the atomic layer deposition process comprises a plurality of deposition cycles, and wherein each deposition cycle comprises:
exposing the substrate to the iridium precursor for about 0.1 seconds to about 1 second while not exposing the substrate to the reducing agent; then
exposing the substrate to a purge gas for about 1 second to about 100 seconds; then
exposing the substrate to the reducing agent for about 1 second to about 20 seconds while not exposing the substrate to the iridium precursor; and then
exposing the substrate to the purge gas for about 1 second to about 100 seconds.

15. The method of claim 1, wherein the substrate comprises a silicon surface and a secondary surface, and wherein the secondary surface comprises silicon nitride, silicon oxide, silicon oxynitride, aluminum oxide, hafnium oxide, alloys thereof, or any combination thereof.

16. The method of claim 15, wherein the iridium material is selectively deposited on the silicon surface over the secondary surface during the atomic layer deposition process.

17. The method of claim 15, wherein the iridium material is deposited on the silicon surface at a rate of about 2 times to about 100 times faster than deposited on the secondary surface during the atomic layer deposition process.

18. A method for forming an iridium material on a substrate, comprising:
sequentially exposing the substrate to an iridium precursor and a reducing agent during an atomic layer deposition process within a process chamber, wherein the substrate comprises a silicon surface and a secondary surface, wherein the reducing agent comprises hydrogen gas ($H_2$), a hydrogen plasma, atomic hydrogen, or any combination thereof, and wherein the iridium precursor comprises iridium hexafluoride; and
selectively depositing the iridium material on the silicon surface of the substrate, wherein the iridium material is metallic iridium which comprises a concentration of greater than 95 at % of iridium and a concentration of about 0.1 ppm to less than 1 at % of fluorine.

19. A method for forming an iridium material on a substrate, comprising:
sequentially exposing the substrate to an iridium precursor and a reducing agent during an atomic layer deposition process within a process chamber, wherein the reducing agent comprises a silicon precursor, wherein the iridium precursor comprises iridium hexafluoride; and
depositing the iridium material on the substrate, wherein the iridium material is an iridium silicide, and wherein the iridium silicide comprises about 10 at % to about 50 at % of silicon and about 0.1 ppm to less than 1 at % of fluorine.

20. The method of claim 19, wherein:
the substrate comprises a silicon surface and a secondary surface;
the secondary surface comprises silicon nitride, silicon oxide, silicon oxynitride, aluminum oxide, hafnium oxide, alloys thereof, or any combination thereof;
the iridium material is selectively deposited on the silicon surface over the secondary surface during the atomic layer deposition process; and
the iridium material is deposited on the silicon surface at a rate of about 2 times to about 100 times faster than deposited on the secondary surface during the atomic layer deposition process.

* * * * *